(12) United States Patent
Myrtveit

(10) Patent No.: US 7,989,093 B2
(45) Date of Patent: Aug. 2, 2011

(54) METHOD OF MAKING A COATED CUTTING TOOL AND THE RESULTING TOOL

(75) Inventor: Toril Myrtveit, Kungsängen (SE)

(73) Assignee: Sandvik Intellectual Property AB, Sandviken (SE)

( * ) Notice: Subject to any disclaimer, the term of this patent is extended or adjusted under 35 U.S.C. 154(b) by 357 days.

(21) Appl. No.: 12/233,095

(22) Filed: Sep. 18, 2008

(65) Prior Publication Data

US 2009/0081479 A1    Mar. 26, 2009

(30) Foreign Application Priority Data

Sep. 26, 2007  (SE) ...................................... 0702140

(51) Int. Cl.
  *B32B 9/00*  (2006.01)
  *C23C 14/32*  (2006.01)
  *C23C 14/58*  (2006.01)

(52) U.S. Cl. ......... 428/697; 51/307; 51/309; 204/192.1; 204/192.15; 204/192.16; 204/192.32; 204/192.35; 428/698; 428/699; 428/701

(58) Field of Classification Search .................... 51/307, 51/309; 204/192.1, 192.15, 192.16, 192.32, 204/192.35; 428/697, 698, 699, 701
See application file for complete search history.

(56) References Cited

U.S. PATENT DOCUMENTS

| | | | |
|---|---|---|---|
| 4,973,388 A * | 11/1990 | Francois et al. | 204/192.16 |
| 5,690,796 A | 11/1997 | DuPont et al. | |
| 6,033,734 A | 3/2000 | Muenz et al. | |
| 6,503,373 B2 * | 1/2003 | Eerden et al. | 204/192.12 |
| 7,241,492 B2 * | 7/2007 | Kohara et al. | 428/698 |
| 7,704,611 B2 * | 4/2010 | Coddet et al. | 51/307 |

FOREIGN PATENT DOCUMENTS

| | | |
|---|---|---|
| EP | 0 756 019 | 1/1997 |
| EP | 1 553 210 | 7/2005 |
| WO | 98/15670 | 4/1998 |

OTHER PUBLICATIONS

Yu Konyashin, Healing of surface defects in hard materials by thin coatings, Mar./Apr.1996, pp. 447-452.

* cited by examiner

*Primary Examiner* — Archene Turner

(74) *Attorney, Agent, or Firm* — Drinker Biddle & Reath LLP

(57) ABSTRACT

The present invention relates to a method of making a coated cutting tool comprising providing a substrate, depositing on said substrate a cathodic arc evaporation PVD coating of nitrides, oxides, borides, carbides, carbonitrides, carbooxynitrides, or combinations thereof wherein the coating during deposition is subjected to more than one ion etching step. Cutting tools made according to the present invention will exhibit an increased life time due to increased smoothness of the PVD coating which is due to a reduced number of surface defects.

11 Claims, 3 Drawing Sheets

METHOD OF MAKING A COATED CUTTING TOOL AND THE RESULTING TOOL

CROSS-REFERENCE TO PRIOR APPLICATION

This application claims priority to Sweden Application No. 0702140-5 filed Sep. 26, 2007, which is incorporated by reference herein.

BACKGROUND OF THE INVENTION

The present invention relates to a method of making PVD-coated cutting tools comprising the deposition of a PVD coating wherein the coating, during the deposition, is subjected to more than one ion etching step. Cutting tools made according to the present invention exhibit an increased tool life due to increased smoothness of the PVD coating which is itself due to a reduced number of surface defects.

Most cutting tools today are coated with PVD or CVD coatings like Ti(C,N), TiN, (Ti,Al)N, (Ti,Si)N, (Al,Cr)N or $Al_2O_3$. PVD coatings are generally thinner than CVD coatings and are often used in applications where toughness is essential, like milling. PVD coatings have several attractive properties compared to CVD-coatings, for instance, greater compressive stress, finer grained coatings and a better ability to tolerate changes in load. Unfortunately, most arc-deposited PVD-coatings suffer from the existence of metallic macroparticles, also called macros or droplets, which exist as small spheres on the surface of the coating or buried inside the coating. During the deposition of the coating, these macroparticles can shadow the incoming flux of charged metal ions, thus creating voids in the coating in the immediate surroundings of the macroparticle. Due to the subsequent diminished adhesion between the macroparticle and the coating, the macroparticle can fall out either during the deposition process or immediately afterwards or even during machining. This may result in an inferior coating quality, with voids, pores or even, in extreme cases, holes straight down to the substrate.

When a coating having macroparticles is used, for example, in a milling operation, there is a risk that the chip will, mechanically and/or chemically, interact with a protruding macroparticle. As the chip flows over the cutting tool surface a small part of the coating may be torn off, leaving a hole or a pore in the coating. This pore or void can be the starting point of cracks. The existence of cracks on the cutting edge will eventually lead to edge chipping or cutting tool breakage.

Ion etching is a common step in the beginning of all kinds of deposition processes. The substrate is usually ion etched prior to deposition to remove surface contaminants and native oxides and nitrides.

U.S. Pat. No. 6,033,734 describe different etching processes performed on a metal substrate surface prior to deposition of PVD coatings. The etching is a metal etching process which is performed by using Cr and/or Mo ions.

However, there have been a few attempts to use ion etching as an intermediate step.

EP 0756019 describes a method of making a PVD-coating for material deforming tools used in punching operations. A PVD-layer composed of (Ti,Al)N, (Ti,Al,Y)N or (Ti,Al,Cr)N or any multilayer thereof is deposited. The surface is then mechanically treated e.g. with sand blasting or metal ion etching to remove any droplets and to achieve a smooth surface. A second, low-friction, PVD coating consisting of $MoS_2$ is then deposited on top.

EP 1 533 210 A describes a process for depositing PVD $\alpha$-$Al_2O_3$. The substrate is first coated with a first hard coating which can be subjected to an ion bombardment either with argon or metal ions. The bombarded surface is then subjected to an oxidation process whereby an oxide surface layer is formed. Onto this oxide surface layer an $Al_2O_3$ layer is deposited which will be $\alpha$-$Al_2O_3$.

OBJECTS AND SUMMARY OF THE INVENTION

It is an object of the present invention to provide a method of making coated cutting tools which reduce the amount of macroparticles inside and on the surface of the coating resulting in a reduced amount of holes, voids and pores in the coating.

It is another object of the present invention to provide a method of making coated cutting tools having less crater wear, less flank wear, less fritting and an increased tool life.

It is another object of the present invention to provide a method of making coated cutting tools which makes it possible to deposit thicker PVD-coatings without the risk of fritting and spalling.

In one aspect of the invention, there is provided a method of making a coated cutting tool comprising providing a substrate and depositing a coating on said substrate with an cathodic arc evaporation PVD deposition process, where the coating is nitrides, oxides, borides, carbides, carbonitrides, carbooxynitrides or combinations thereof and wherein the deposition process also comprises subjecting the coating to more than one separate intermediate ion etching step.

In another aspect of the invention, there is provided a coated cutting tool made according to the above-described method.

DETAILED DESCRIPTION OF THE PREFERRED EMBODIMENTS

Figure 1:
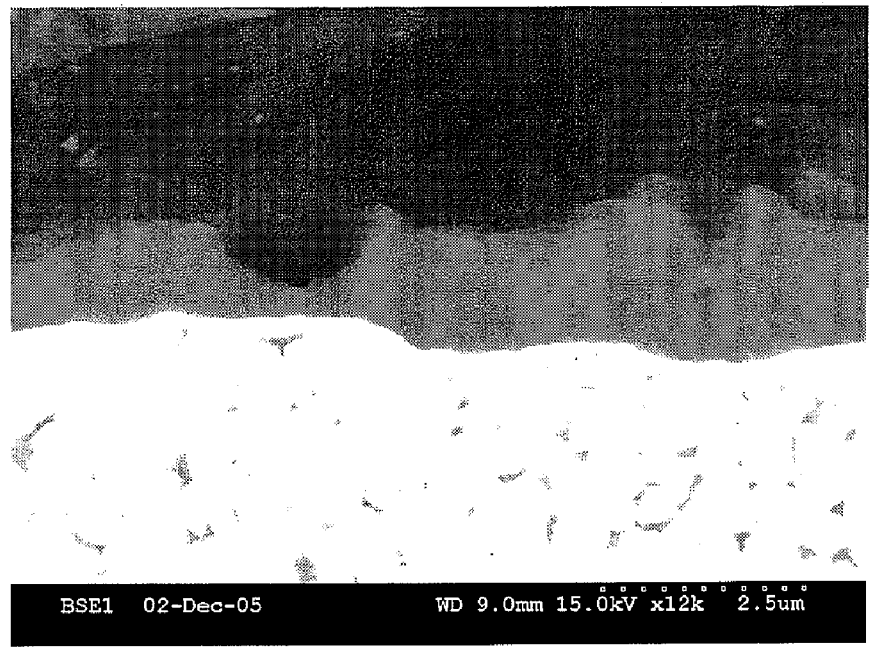
FIG. 1 shows a polished cross section of a PVD-deposited (Ti,Al)N coating deposited according to prior art.

It has surprisingly been found that a method of making a coated cutting tool which comprises providing a substrate, and onto said substrate, depositing a coating with the PVD cathodic arc evaporation deposition process and wherein the coating during the deposition process is subjected to more than one ion etching step, a smoother PVD coating having a decreased amount of macroparticles can be achieved and thus the objects disclosed above can be reached.

The present invention relates to a method of making a coated cutting tool comprising providing a substrate and depositing a coating on the said substrate with a cathodic arc evaporation PVD deposition process, wherein the coating is subjected to more than one ion etching steps utilizing the deposition chamber. The ion etching steps are achieved by ion bombardment, as separate intermediate steps, meaning that the actual deposition is stopped during the etching step and is then resumed after the etching step. The ions used can be either argon ions or metal ions. The ion etching will remove protruding parts of the coating as well as coating material with inferior adherence to the rest of the coating, such as macroparticles. The method will make it possible to achieve smooth PVD coatings having a decreased amount of surface defects, the so-called macroparticles.

The ion etching can be performed at any temperature suitable for depositing PVD coatings, but preferably at a temperature of from about 450 to about 600° C. The pressure during the etching step is preferably from about 1 to about 5 μbar, more preferably from about 1 to about 3 μbar.

In one embodiment of the present invention, argon ions are used. The argon ions are obtained by igniting a plasma in the deposition chamber which is filled with argon gas. The argon ions are accelerated towards the substrate which is being kept at a negative potential, preferably between from about 80 to about 250 V, more preferably between from about 100 to about 200V.

In another embodiment of the present invention, metal ions are used. The metal ions are achieved by generating plasma at specific etching targets in the deposition chamber, which is evacuated, and thus forming a dense vapor of metal ions which are accelerated towards the substrates which are being kept at a high negative potential, preferably between from about 150 to about 1500 V, more preferably from about 200 to about 1000 V. The metal ions are preferably one or more of Ti, Zr, Cr, Nb, V, Mo, more preferably Cr or Mo.

In one embodiment of the present invention, the ion etching steps are intermediate steps, which mean that the ion etching steps will be alternated with deposition steps. During the etching, no deposition takes place. When the ion etching step is an intermediate step and this operation is repeated a number of times, macroparticles are in part or completely removed and the voids left behind as they fall off will be filled with new coating material during the next deposition stage. Thus, deep and large pores are effectively avoided, creating a dense, homogeneous coating with a minimum of surface defects.

In another embodiment of the present invention, an additional ion etching step is performed as a final step after completion of the deposition of the PVD coating. This will lead to a smooth surface of the PVD coating.

The deposited PVD coating can have any composition suitable for cutting tools, such as nitrides, oxides, borides, carbides, carbonitrides, carbooxynitrides or combinations thereof. Preferably, the coating comprises one or more layers of one or more of (Al,Ti)N, TiN, Ti(C,N), (Al,Cr)N, CrN, AlO, (Ti,Si)N, TiBN, TiB, (Ti,Al,X)N, where X can be one or more of Si, B, C, Ta, V, Y, Cr, Hf, Zr, more preferably (Al,Ti)N, (Ti,Si)N, TiBN, (Ti,Al,X)N, where X is as defined above and most preferably (Al,Ti)N.

The PVD coatings used according to the present invention can be either homogenous or multilayered coatings. The ion etching can be performed either as more than one intermediate step in a layer of homogenous composition, in between layers each being homogenous but having different compositions, or as more than one intermediate step in multilayered coatings, or any combination thereof. By multilayered coatings are herein meant coatings comprising at least 5, preferably at least 10 individual layers. However, it can comprise up to several thousand individual layers.

The ion etching step included in the method of the present invention can be applied to most PVD techniques, although it is of special interest in cathodic arc deposition where macroparticles are more prominent.

The thickness of the PVD coating can be within a wide range since the method according to the present invention makes it possible to deposit coatings thicker than the conventional PVD coatings. The coating thickness can be from about 0.1 to about 10 μm, preferably from about 0.5 to about 6 μm and most preferably from about 1 to about 5 μm.

Substrates suitable for the present invention are preferably cutting tool inserts, or round tools such as drills, end mills etc. The substrate is preferably made of any one of cemented carbide, cermets, ceramics, cubic boronitride or high speed steels.

The invention further relates to a cutting tool made according to the process described above.

It has been discovered that cutting tools made according to the present invention will obtain smoother coatings due to the decreased amounts of macroparticles. A smooth coating will lead to a number of improvements. For example, the chip will flow more easily over the tool surface, only marginally interacting with the coating, thus decreasing the risk of spalling. A smooth coating will also give increased crater wear resistance due to lower temperatures, decrease the risk of build-up-edge, notch wear, edge line fritting and cracking and also minimize the risk of chip congestion on round tools and subsequent tool breakage. Smoother coatings with less attrition wear will also allow thicker coatings without adhesion problems.

A smooth coating is also beneficial in interrupted cuts in turning causing shock-loads during entry and exit in the work material. A smooth coating will in this case significantly decrease the risk of catastrophic breakage.

The invention is additionally illustrated in connection with the following examples, which are to be considered as illustrative of the present invention. It should be understood, however, that the invention is not limited to the specific details of the examples.

EXAMPLE 1

Cemented carbide inserts with different geometries, CNMG120408-MM, R290-12T308M-KM and R390-11T0308M-PM, depending on type of operation (turning, milling etc.) were coated with a standard $Ti_{0.33}Al_{0.67}N$ coating. The coating was deposited by cathodic arc evaporation in an $N_2$-atmosphere and the inserts were mounted on a 3-fold rotating substrate table. The (Ti,Al)N coating was deposited from two pairs of $Ti_{0.33}Al_{0.67}$-targets.

Inserts A were coated in accordance with prior art, by depositing a 4 μm thick layer as measured in the middle of the flank side.

Inserts B were coated in accordance with the present invention. The same deposition conditions as for inserts A were applied except that, after having deposited a layer of thickness 0.7-0.8 μm, the deposition was stopped, and the reactor chamber was filled with argon gas. A negative bias was applied to the inserts and the plasma was ignited, and the inserts were bombarded with argon ions. After ion bombardment, the deposition was restarted and a new $Ti_{0.33}Al_{0.67}N$-layer was deposited. This procedure was repeated 6 times until a total coating thickness 4 μm was achieved. As a final step, a surface treatment was conducted where the inserts again were subject to ion bombardment before the deposition cycle was terminated and the chamber opened.

Figure 2:
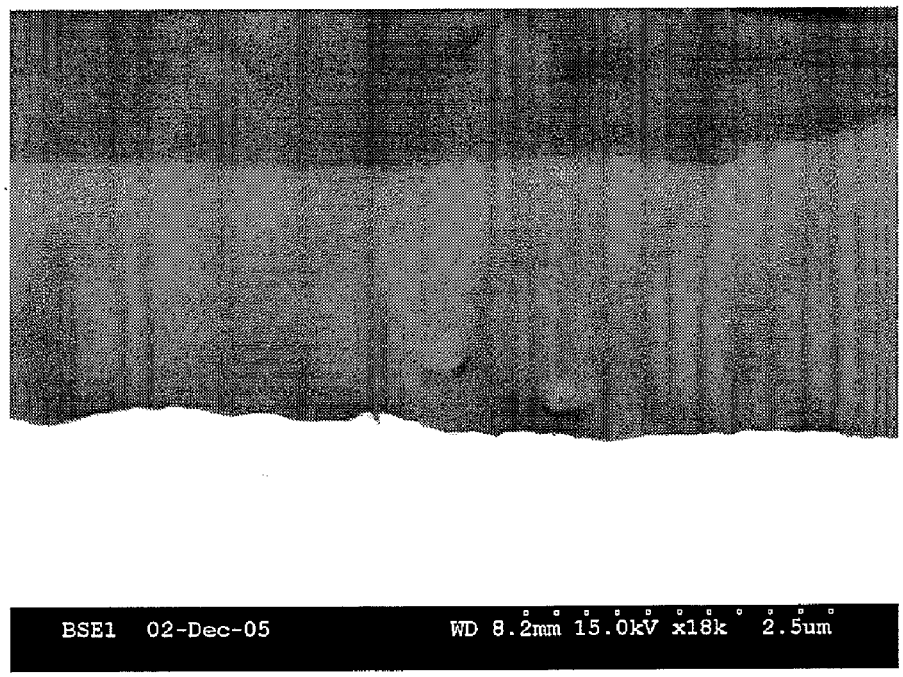
FIG. 2 shows a polished cross section of a coating deposited according to the present invention.
Figure 3:
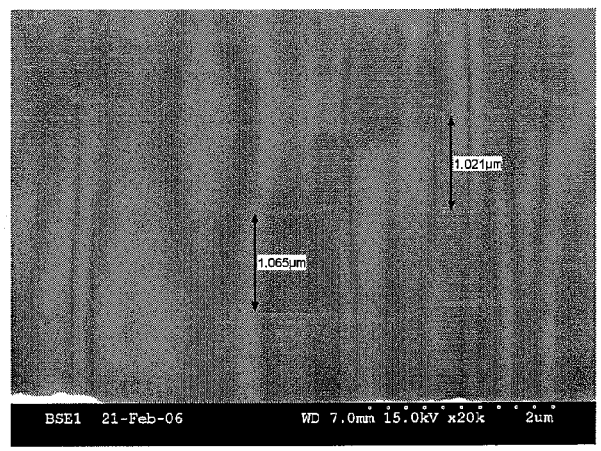
FIG. 3 is a close up of the coating from FIG. 2.
Figure 4:
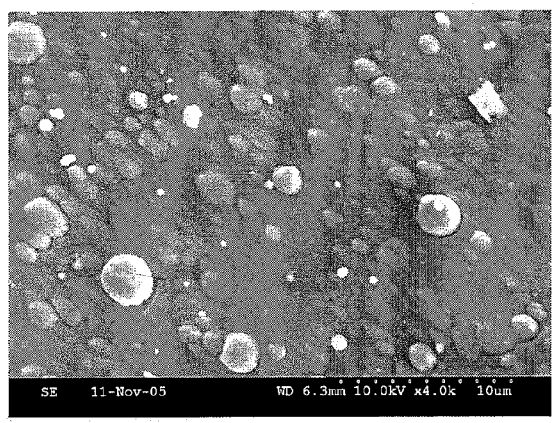
FIG. 4 and FIG. 5 shows top view FEGSEM images of the coatings from FIG. 1 and FIG. 2, respectively.
Figure 5:
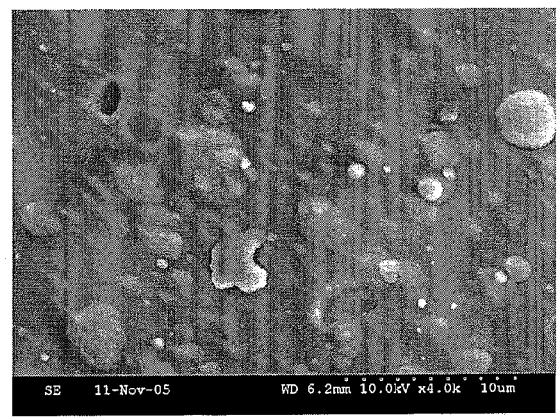
Figure 6:
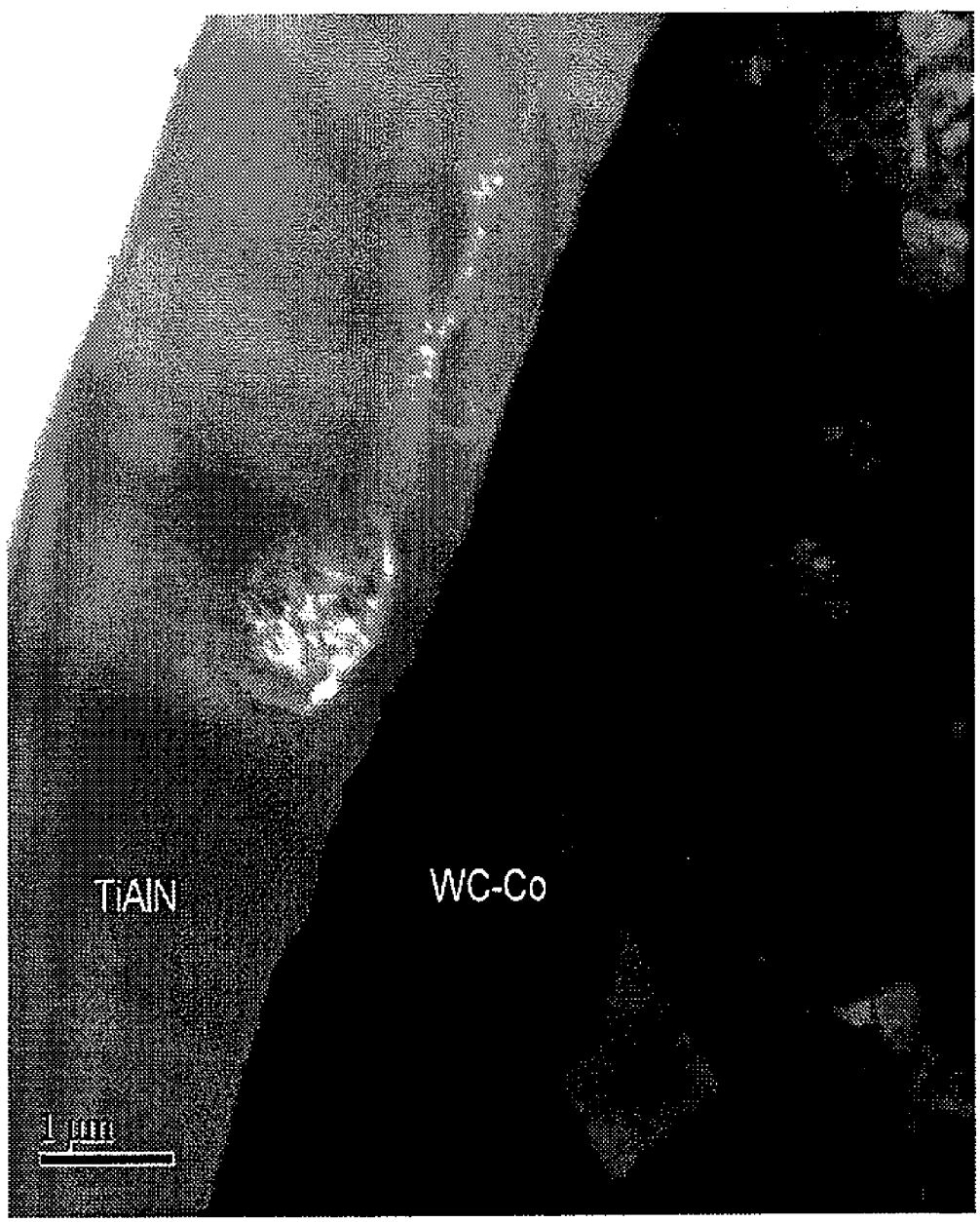
FIG. 6 shows a TEM bright field image of how the macroparticles are embedded in the coating and thus are covered by a new coating layer.

A SEM-picture of the coating of insert A in cross section can be seen in FIG. 1. It shows that pores can be seen where a droplet has fallen out, leaving only a very thin coating layer covering the substrate. SEM-pictures of the coating of insert B can be seen in FIGS. 2 and 3. In FIG. 2 it can be seen that the top surface is smoother with less pores and voids. Some macros can still be seen embedded in the coating, but these are securely attached without voids surrounding them. In FIG. 3, which is a close up of FIG. 2, several thin lines are evident in the coating. This is due to the ion bombardment process. Ions will preferentially etch lighter elements as Al, leaving behind a Ti-enriched zone. FIG. 4 and FIG. 5 shows top view FEG-SEM images of the coatings from FIG. 1 and FIG. 2, respectively.

EXAMPLE 2

Cubic boronitride inserts were coated in accordance with the inserts of example 1, but with the exception that the coating in this case was a homogeneous TiN coating deposited from 2 pairs of Ti targets. Inserts C were deposited according to prior art, reaching a coating thickness of 4 µm, as measured in the middle of the flank side. Inserts D, according to the present invention, were deposited the same way, with the exception that after the deposition the chamber was filled with argon, plasma was ignited and the insert was bombarded with argon ions.

EXAMPLE 3

Cemented carbide milling inserts with geometry CNMG120408-MM were coated with aperiodic multilayers of (Ti,Al)N deposited with cathodic arc evaporation in an $N_2$-atmosphere and the inserts were mounted on a 3-fold rotating substrate table arranged in order to obtain the aperiodic structure. The multilayers were deposited from two pairs of $Ti_{0.33}Al_{0.67}$-targets and one pair of Ti-targets being run simultaneously. Inserts E, coated in accordance with prior art, reached a coating thickness of 4 µm, as measured in the middle of the rake side of the insert.

During the deposition of inserts F, (present invention), the deposition was stopped after having deposited a layer with a thickness 1.5 µm and the reactor chamber was filled with argon. A negative bias was applied to the inserts. Plasma was ignited, and the inserts bombarded with argon ions. After ion bombardment, the deposition was restarted and another 1.5 µm was deposited, the inserts were ion etched and the rest of the coating deposited. As a final step, a surface treatment was conducted where the insert again were subject to ion bombardment before the deposition cycle was terminated and the chamber opened. The total coating thickness was 4 µm.

EXPLANATIONS TO EXAMPLES 4-8

The following expressions/terms are commonly used in metal cutting, and explained in the table below:

| | |
|---|---|
| Vc (m/min): | cutting speed in meters per minute |
| fz (mm/tooth): | feed rate in millimeter per tooth |
| z (number): | number of teeth in the cutter |
| ae (mm): | radial depth of cut in millimeter |
| ap (mm): | axial depth of cut in millimeter |
| D (mm): | cutter diameter in millimeter |

EXAMPLE 4

Inserts A (prior art) and B (invention) with geometry CNMG120408-MM from example 1 were tested in a turning operation during the following cutting conditions:

| | |
|---|---|
| Work piece material: | Hard steel Ovako 825 B |
| $V_c =$ | 110 m/min |
| $f_z =$ | 0.3 mm/turn |
| a = | 2 mm |
| Coolant: | emulsion |

Tool life criterion was flank wear exceeding 0.3 mm or insert failure. Insert A (prior art) lasted 14 minutes in this application, whereas insert B (invention) lasted 21 minutes.

EXAMPLE 5

Inserts A (prior art) and B (invention) with geometry R290-12T308M-KM from example 1 were tested and compared in a milling operation.

| | |
|---|---|
| Work piece material: | CGI (compacted graphite iron) Sintercast |
| $V_c =$ | 300 m/min, |
| $f_z =$ | 0.15 mm/tooth |
| $a_e =$ | 50 mm |
| $a_p =$ | 3 mm |
| z = | 3 |
| D = | 63 mm |
| Notes: | Dry conditions |

Insert A (prior art) lasted only 32 minutes in this application, whereas insert B (invention) lasted 45 minutes. Decisive difference in wear type for increasing the tool life was less fritting.

EXAMPLE 6

Inserts A (prior art) and B (invention) coated according to example 1 having the geometry R390-11T0308M-PM were tested in a milling operation during the following cutting conditions:

| | |
|---|---|
| Work piece material: | low alloy steel, SS2244 |
| $V_c =$ | 150 m/min |
| $f_z =$ | 0.15 mm/tooth |
| $a_e =$ | 25 mm |
| $a_p =$ | 3 mm |
| z = | 2 |
| D = | 25 mm |
| Note: | Coolant: emulsion |

Tool life criterion was flank wear more than 0.2 mm or fritting more than 0.3 mm.

Insert A (prior art), lasted 30 minutes in this application whereas insert B (invention) lasted 37 minutes.

At an increased Vc=200 m/min, insert A (prior art) lasted 20 min whereas insert B (invention), lasted for 25 min.

Decisive difference in wear type for increasing the tool life was less chipping in the edge line combined with less flank wear. Interestingly, the insert B (invention) showed a slow and steady increase in wear whereas insert A (prior art) suffered from a more catastrophic failure.

EXAMPLE 7

Cubic boronitride inserts C (prior art) and D (invention) with the geometry CNGA120408T01030AWH were tested in a turning operation. The test body was in the form of a ring with a jack of 10 mm with a 90 degree entry and exit angle. The feed rate was increased in steps, beginning at 0.20 mm/r and increased with 0.02 mm/r for each cut.

| | |
|---|---|
| Work piece material: | low-alloy steel SS2258, HRC = 56. |
| Tool holder: | C5-DCLNL-35060-12 |
| $V_c =$ | 120 m/min |
| $F_n =$ | $A_p$ |
| $a_p =$ | initially 0.20 mm/r, increased in steps of 0.02 mm/r for each cut |
| Note: | dry conditions |

Tool life time criterion was insert breakage.

Insert C (prior art) suffered from insert breakage at a feed of 0.34 mm/r, whereas the insert D (invention) lasted until the feed reached 0.50 mm/r.

EXAMPLE 8

Inserts E (prior art) and F (invention) with geometry CNMG120408-MM from example 3 were tested in a turning operation during the following cutting conditions:

| | |
|---|---|
| Work piece material: | Hard steel ovako 825 B |
| $V_c =$ | 160 m/min |
| $f_z =$ | 0.3 mm/turn |
| a = | 2 mm |
| Coolant: | emulsion |

Tool life criterion was flank wear exceeding 0.45 mm or insert failure. Insert E (prior art) lasted 17 minutes in this application, whereas insert F (invention) lasted 21 minutes. Decisive difference in wear type for increasing the tool life was better crater wear resistance.

Although the present invention has been described in connection with preferred embodiments thereof, it will be appreciated by those skilled in the art that additions, deletions, modifications, and substitutions not specifically described may be made without department from the spirit and scope of the invention as defined in the appended claims.

The invention claimed is:

1. A method of making a coated cutting tool comprising:
   providing a substrate and
   depositing a coating on said substrate with an cathodic arc evaporation PVD deposition process, where the coating is nitrides, oxides, borides, carbides, carbonitrides, carbooxynitrides or combinations thereof and
   wherein the deposition process also comprises subjecting the coating to more than one separate intermediate ion etching step.

2. The method according to claim 1 wherein the ion etching is performed with argon ions.

3. The method according to claim 1 wherein the ion etching is performed with metal ions.

4. The method according to claim 3 wherein the ion etching is performed with one or more of the ions Ti, Zr, Cr, Nb, V, or Mo.

5. The method according to claim 4 wherein the ion etching is performed with one or more of the ions Cr or Mo.

6. The method according to claim 1 wherein a final ion etching step of the coating is performed after completion of the deposition of the coating.

7. The method of claim 1 wherein the PVD coating comprises one or more layers of one or more of (Al,Ti)N, TiN, Ti(C,N), (Al,Cr)N, CrN, AlO, (Ti,Si)N, TiBN, TiB, or (Ti,Al,X)N, where X can be one or more of Si, B, C, Ta, V, Y, Cr, Hf, or Zr.

8. The method of claim 7 wherein the PVD coating comprises one or more layers of one or more of (Al,Ti)N, (Ti,Si)N, TiBN, or (Ti,Al,X)N where X is one or more of Si, B, C, Ta, V, Y, Cr, Hf, Zr.

9. The method of claim 8 wherein the PVD coating comprises one or more layers of (Al,Ti)N.

10. The method of claim 1 wherein the substrate is made of cemented carbide, cermets, ceramics, cubic boronitride or high speed steel.

11. The coated cutting tool made according to claim 1.

\* \* \* \* \*